United States Patent [19]

Yasuzato

[11] Patent Number: 5,644,390
[45] Date of Patent: Jul. 1, 1997

[54] INTENSITY DISTRIBUTION SIMULATING METHOD

[75] Inventor: Tadao Yasuzato, Tokyo, Japan

[73] Assignee: NEC Corporation, Tokyo, Japan

[21] Appl. No.: 381,326

[22] Filed: Jan. 31, 1995

[30] Foreign Application Priority Data

Jan. 31, 1994 [JP] Japan ................................. 6-009011

[51] Int. Cl.$^6$ ............................. G01J 1/00; G02B 27/10
[52] U.S. Cl. ........................ 356/121; 355/67; 359/619
[58] Field of Search ................................. 356/121, 122,
356/222, 226, 401; 355/68, 53, 71, 67,
70; 250/548; 359/619, 618, 626–628; 362/268

[56] References Cited

U.S. PATENT DOCUMENTS

| | | | |
|---|---|---|---|
| 4,428,647 | 1/1984 | Sprague et al. | 359/619 |
| 4,798,962 | 1/1989 | Matsumoto et al. | 356/401 |
| 4,799,791 | 1/1989 | Echizen et al. | 356/121 |
| 5,067,811 | 11/1991 | Ouchi | 356/121 |
| 5,091,744 | 2/1992 | Omata | 355/53 |
| 5,333,077 | 7/1994 | Legar et al. | 359/619 |

FOREIGN PATENT DOCUMENTS

| | | | |
|---|---|---|---|
| 1497272 | 5/1969 | Germany | 359/619 |
| 61-91662 | 5/1986 | Japan . | |
| 0227121 | 9/1989 | Japan | 359/619 |
| 3-216658 | 9/1991 | Japan . | |

OTHER PUBLICATIONS

M. Yeung, *Modeling Aerial Images in Two and Three Dimensions*, Proceedings of the Kodak Microelectronics seminar Interface '85, 1986, pp. 115–126.

M. Born et al., *Principles of Optics Electromagnetic Theory of Propagation, Interference and Diffraction of Light*, pp. 491–555.

*Primary Examiner*—Hoa Q. Pham
*Attorney, Agent, or Firm*—Foley & Lardner

[57] ABSTRACT

In an intensity distribution simulation method for a demagnification projection aligner, the light intensity distribution due to each of unit lenses constituting an integrator is approximated with a Gaussian-distribution approximate equation to thereby model the integrator, and the light intensity distribution of a reticle pattern (mask pattern) on an image plane is calculated on the basis of the calculated light intensity distribution of the modeled integrator.

18 Claims, 8 Drawing Sheets

INTENSITY DISTRIBUTION SIMULATING METHOD

BACKGROUND OF THE INVENTION

1. Field of the Invention

This invention relates to an intensity distribution simulating method, and particularly to an intensity distribution simulating method for use in a lithographic process for manufacturing semiconductor devices.

2. Description of the Related Art

Photolithography has been mainly utilized in a lithographic process which is one of the processes for manufacturing semiconductor devices. The recent development of photolithography has enabled mass-production of semiconductor devices having the minimum line width (resolution) below 0.5 μm because a projection lens of a demagnification projection aligner (a reducing projection type of exposure device) can be designed to have a higher numerical aperture (NA). The increase of the numerical aperture (NA) enables improvement in resolution, but it increasingly causes reduction in depth of focus. Therefore, in the case where a finer pattern having a line width below 0.35 μm is required to be formed, it has become increasingly impossible that the mass-production of semiconductor devices is stably performed by merely increasing the NA (numerical aperture) of the projection lens.

In order to overcome this circumstance, much attention has been paid to a so-called oblique illumination technique in which the resolution characteristics can be improved by optimizing an illumination system. For example, Japanese Laid-open Patent Application No. Sho-61-91662 which is titled "PROJECTION DEVICE" proposes a method which is required to perform the above oblique illumination technique for a demagnification projection aligner. In this proposed method, a specific diaphragm is disposed just behind an integrator (fly-eye lens) which is an optical element for improving in-plane homogeneity of illumination, thereby changing the shape of an effective light source as described later. The integrator is an optical element which is formed by bundling the same type of several tens unit (simple, or single) lenses each of which has the rectangular and slender shape. The respective unit lenses are individually focalized to form the effective light source.

An extra-high pressure mercury lamp is used as an original light source for illuminating patterns (reticle patterns) on a mask in a general demagnification projection aligner. The extra-high pressure mercury lamp emits light in a relatively broad range, so that the light emitted from the original light source does not have a high coherence. However, if the integrator is used in this system, the coherence of lights which are emitted from the ultra-high pressure mercury lamp and focused by the respective unit lenses of the integrator becomes higher, so that these lights can function as independent point-sources of light. Accordingly, it can be obtained as an imaging characteristic by this effect that the illumination is not affected by the shape of the original light source (ultra-high pressure mercury lamp), but affected by the shape of only the point-source group of the integrator. Therefore, the group of the point-sources which constitute the integrator is called an "effective light source".

Figure 7A:
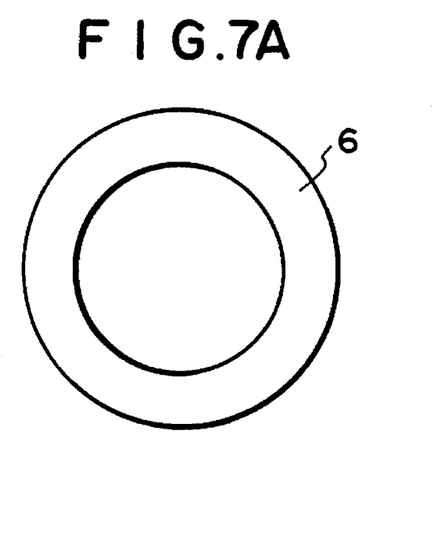
FIG. 7A shows an embodiment of the diaphragm.
Figure 7B:
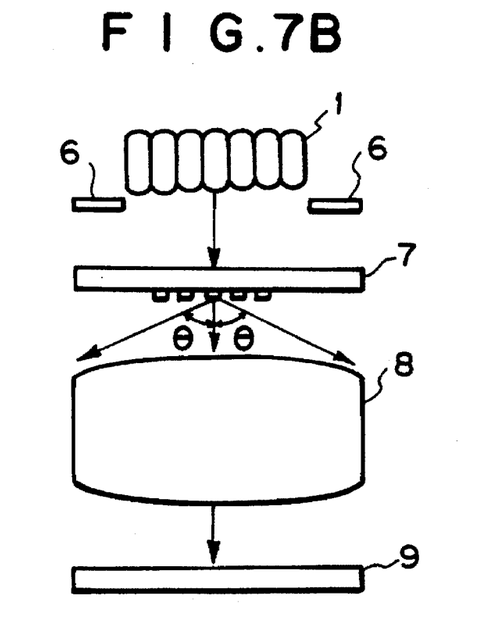
FIG. 7B shows a projection aligner using the diaphragm show in FIG. 7A.
Figure 7C:
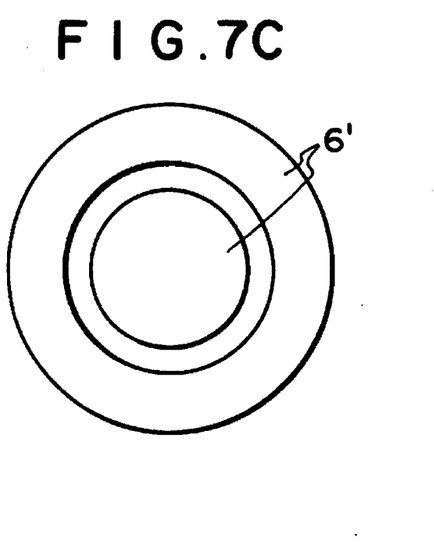
FIG. 7C shows another embodiment of the diaphragm and FIG. 7D shows a projection aligner using the diaphragm shown in FIG. 7C.
Figure 7D:
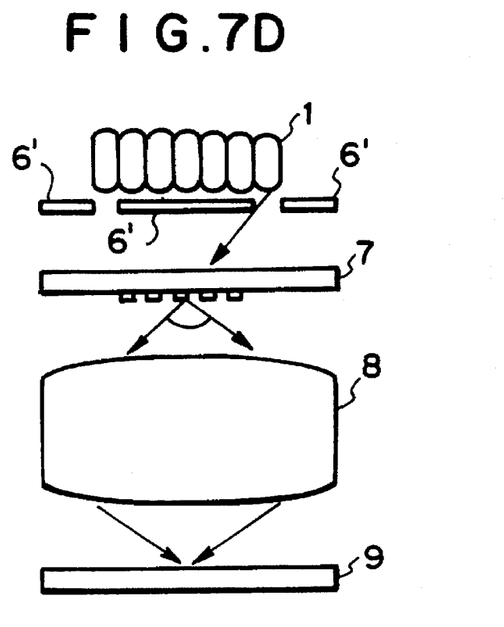

Generally, in order to resolve an image pattern, of all diffracted lights, zero-order diffracted light and +primary diffracted light or −primary diffracted light are required to be collected. However, if a diaphragm 6 shown in FIG. 7A is used in a projection device as shown in FIG. 7B, a diffraction angle θ of diffracted light from a reticle (mask) 7 becomes larger as a pattern is finer, so that the diffracted light is not incident to a projection lens system 8 and thus no pattern is resolved. On the other hand, if a ring-shaped diaphragm 6' shown in FIG. 7C is used in a projection device as shown in FIG. 7D, light emitted from the integrator is incident to the reticle (mask) 7 only in an oblique direction, so that any one of +primary diffracted light and −primary diffracted light is incident to the projection lens system 8. Therefore, a finer pattern can be resolved. In addition to the circular zonal illumination technique as described above, a four-point illumination technique of illuminating light at four points is also used to particularly improve the resolution characteristics of longitudinal and lateral patterns. In these cases, the optimum diaphragm is selected in accordance with each reticle pattern to broaden the manufacturing margin of the semiconductor devices.

As described above, at the recent stage where the requirement in the market approaches to the functional limitation of the photolithography, it has been increasingly required to select the optimum exposure method in accordance with each reticle pattern to broaden the process margin as much as possible. In order to satisfy this requirement, a simulation method for determining the optimum exposure system becomes more important. That is, a light intensity distribution simulation which is matched with various kinds of oblique illumination techniques as described above has been increasingly required to keep sufficient process margin in accordance with various reticle patterns. However, in the oblique illumination technique, abnormal deformation of patterns may occur due to a proximity effect of the exposure system although the resolution and the depth of focus are improved. In order to avoid such an adverse effect due to the proximity effect, an accurate consideration based on the intensity distribution simulation has been increasingly indispensable for the manufacturing of the semiconductor devices.

Next, a general light intensity simulation will be briefly described.

Figure 10:
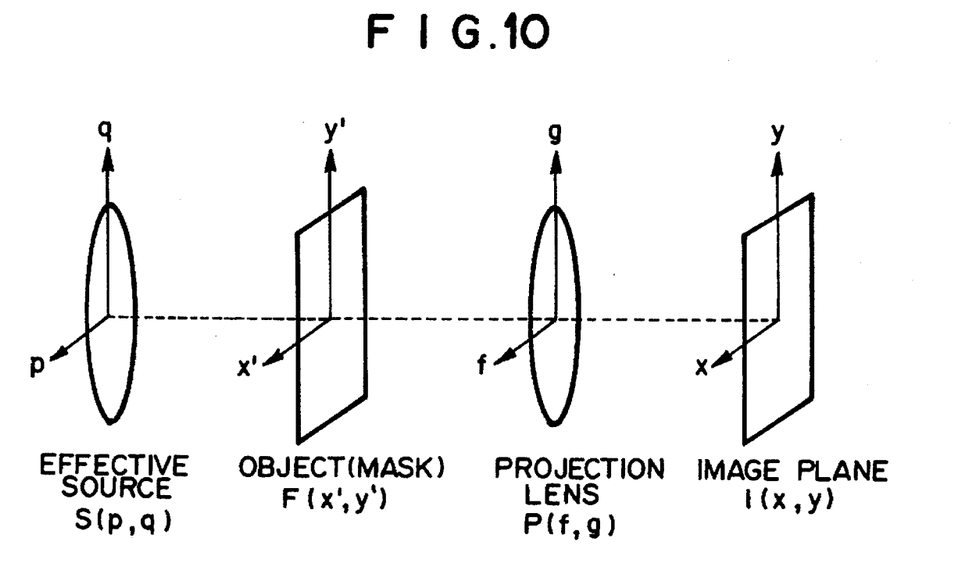
FIG. 10 shows a coordinate system of an effective source object, an object (mask), a projection lens, and an image plane.

Hopkins theory is most well known as one for the light intensity simulation method. According to the Hopkins theory, in the case of a partially coherent illumination system, the intensity distribution $I(x,y)$ of a reticle pattern over an image plane is calculated on the basis of the Fourier transform of the object (reticle pattern or mask pattern) transmission function $F(x',y')$ and of the inverse Fourier transform of the coherent transmission cross-coefficient (hereinafter referred to as "TCC") function. The coherent transmission cross-coefficient represents the degree of variation of the intensity distribution due to coherence, and it is calculated on the basis of the pupil function of the projection lens system and the light intensity distribution function S of the effective light source. Accordingly, according to the light intensity simulation using the Hopkins theory as described above, the light intensity distribution $I(x,y)$ represented by the equation (1) is calculated according to the following procedures (i) to (iv) (in the following equations, $(x',y')$ represents a coordinate on an object (reticle or mask), $(x,y)$ represents a coordinate on an image plane (photoresist face), and the coordinate system of these is shown by FIG. 10:

$$I(x,y) = \int \int \int \int_{-\infty}^{\infty} F(f-f,g'-g;f,g')F(f-f,g-g')F^*(-f,-g')e^{2\pi j(fx+gy)}df\,dg'\,df\,dg \quad (1)$$

Procedure (i) calculates the Fourier transform of a reticle pattern as where F(f,g) of equation (2) is the spatial spectrum of the object transmission function F(x',y');

$$F(f,g) = \int \int_{-\infty}^{\infty} F(x',y')e^{-2\pi j(fx'+gy')}dx'dy' \quad (2)$$

Procedure (ii) calculates the TCC F(f,g;f',g') of the optical system; procedure (iii) calculates the double integral of equation (3) for the results of procedures (i) and (ii);

$$\int \int_{-\infty}^{\infty} F(f-f,g'-g;f,g')F(f-f,g-g')F^*(-f,-g')df\,dg' \quad (3)$$

and procedure (iv) takes the inverse of Fourier transform of the function of procedure (iii) to obtain I(x,y).

The treatment of the optical system on the basis of the coherent transmission cross-coefficient TCC requires the numerical integration to be carried several times (Hopkins theory requires quadruple integration), so that this theory is theoretically excellent, but it is not practical. In view of the disadvantage of the Hopkins' method as described above, the M.Yeung's method (Proceedings of the Kodak Microelectronics seminar INTERFACE '85, (1986) PP115–126) is used because it is suitable for computer's calculation.

According to the Hopkins theory as described above, the characteristics of the optical system, that is, the characteristic of the effective light source and the characteristic of the projection lens system are collectively treated with only the coherent transmission cross-coefficient TCC. On the other hand, according to the Yeung's method, these characteristics are individually and independently treated with. This method is described in Japanese Laid-open Patent Application No. Hei-3-216658, for example. In this method, the effective light source of the integrator is divided into a finite number of point sources, and a projection image due to the whole effective light source of the integrator is obtained by superposing respective projection images due to the respective point sources over one another. In this method, the following assumption is introduced. That is, light emitted from each point source is treated as perfect coherent light, and a projection image due to each point source is incoherent to projection images due to the other point sources. Accordingly, if a projection image due to each point source is calculated and then all the projection images due to the respective point sources are summed up (superposed), the projection image due to the integrator (effective light source) could be obtained.

Here, the Yeung's method as described above will be briefly described with reference to FIG. 8.

Figure 8:
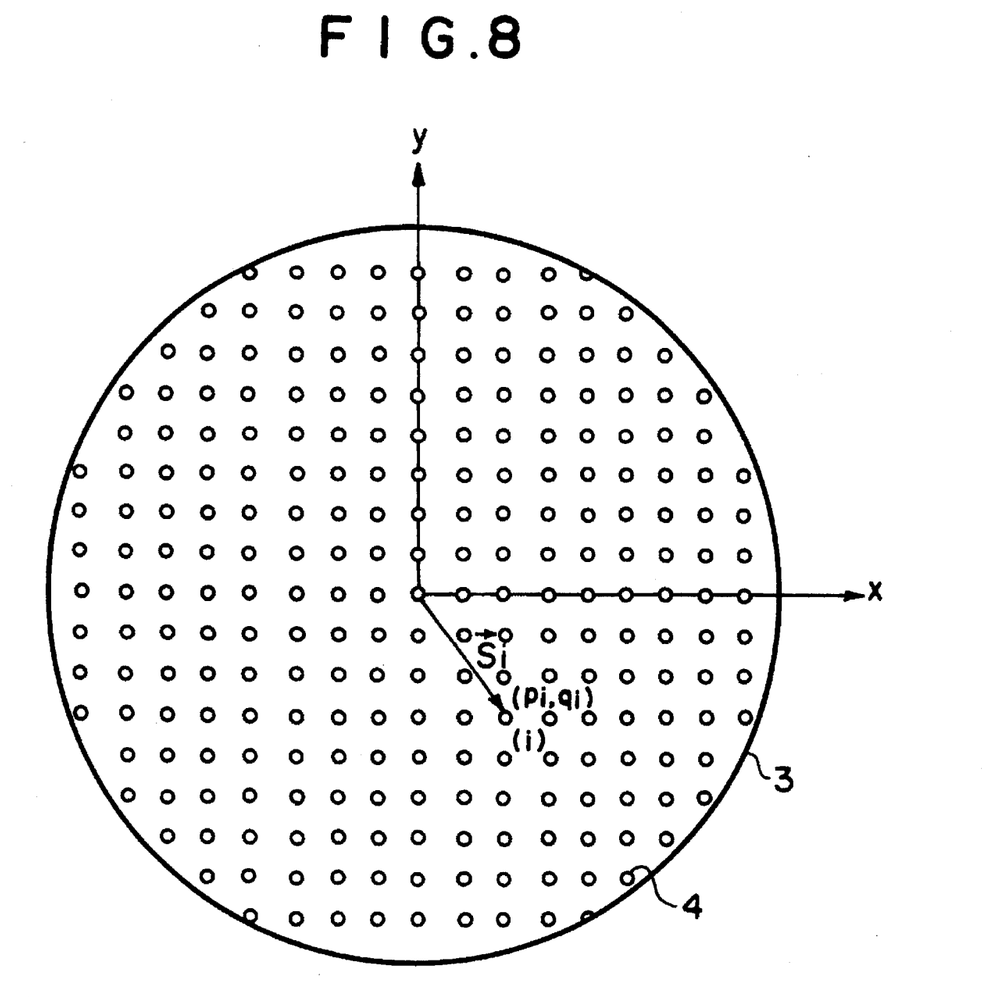
FIG. 8 shows an effective light source, which comprises point sources arranged in an effective range.

First, an effective light source is divided into point sources as shown in FIG. 8. In this case, the number of the point sources is represented by n. Here, the light emitted from an i-th point source is represented by an unit vector Si, and the components (direction cosines) of the unit vector Si on the coordinate system (x',y') of the object plane (reticle plane) are represented by pi and qi. In this case, the amplitude of the light emitted from the i-th point source incident on the object plane is given by a function of Ai and the direction cosines pi and qi:

Ai*exp{j(2π/λ)(pix'+qiy')}, where λ represents the wavelength of the light in the medium and Ai represents a complex number characterizing the intensity and phase of the light of the i-th point source. Accordingly, the amplitude of transmission light due to the i-th point source through the reticle (hereinafter referred to as "the reticle transmission light amplitude of the i-th point source") is represented by the product of the above function and the object (reticle) transmission function F(x',y'):

Ai*F(x',y')exp{j(2π/λ)(pix'+qiy')}.

Here, let us consider a projection image corresponding to a reticle pattern due to the i-th point source (coherent light source). Now, the coherent transfer function of the optical system is represented by K(x—x',y—y'). This function is the amplitude of the light arriving at the point (x,y) on the image plane due to an unit point source at the point (x',y') on the object plane. The amplitude distribution Ui of light over the image plane due to the lights emitted from all parts of the object (reticle) plane is obtained by the integral calculus of the reticle transmission light amplitude of the i-th point source and the coherent transfer function K of the optical system. The intensity distribution of the projection image of the reticle pattern due to the i-th point source is equal to the second power of the amplitude distribution Ui, and the light intensity distribution I(x,y) of the whole effective light sources (n pieces) is represented as follows:

$$I(x,y) = |Ui(x,y)|^2 = \sum_i |Ai|^2 \left| \int \int_{-\infty}^{\infty} F(x',y')e^{j(2\pi/\lambda)(pix'+qiy')}K(x-x',y-y')dx'dy' \right|^2 \quad (4)$$

That is, I(x,y)=Σ|Ai|².|amplitude value on the image plane due to the i-th point source|²

Here, if all the point sources of n are of equal intensity, then |Ai|²=1/n for all i=1, 2, . . . , n, where n represents the total number of the point sources.

The equation (4) is still not in the most convenient form for the computer calculations. Using the convolution theorem in the Fourier transformation theory, the above equation may be rewritten as follows:

$$I(x,y) = \frac{1}{n} \sum_i \left| \int \int_{-\infty}^{\infty} F(f-pi/\lambda,g-qi/\lambda)K'(f,g)e^{2\pi j(fx+gy)}df\,dg \right|^2 \quad (5)$$

where F'(f,g) is the Fourier transform of the object (reticle) transmission (distribution) F(x',y') and given by the equation (2), and K'(f,g) is the Fourier transform of the coherent transfer function K(x—x',y—y') of the optical system. Therefore, the intensity distribution I(x,y) is represented by the sum of the squared absolute value of the inverse Fourier transform of the product between the Fourier transform K'(f,g) of the coherent transfer function K(x—x',y—y') and the Fourier transform $F'(f-pi/\lambda, g-qi/\lambda)$ of the reticle transmission distribution $F(x',y')$. The function $K(f,g)$ is calculated on the basis of the pupil function P. Therefore, the intensity distribution $I(x,y)$ is calculated according to the following computer's calculation procedure:

(1) calculate the Fourier transform of the reticle pattern;

(2) calculate the Fourier transform K' of the coherent transfer function K with the pupil function P;

(3) fix the direction cosines pi and qi for each point source, and then calculate the product of the functions F' and K' for each point source;

(4) take the Fourier transform of the result of (3), and then add the second power of the absolute value of the obtained Fourier transform to the whole intensity distribution $I(x,y)$; and (5) repeat the calculations of (3) and (4) for all the point sources.

This simulation method has a smaller number of integration steps than the method using the Hopkins theory, and thus it is more suitable for the computer's calculations.

Figure 9A:
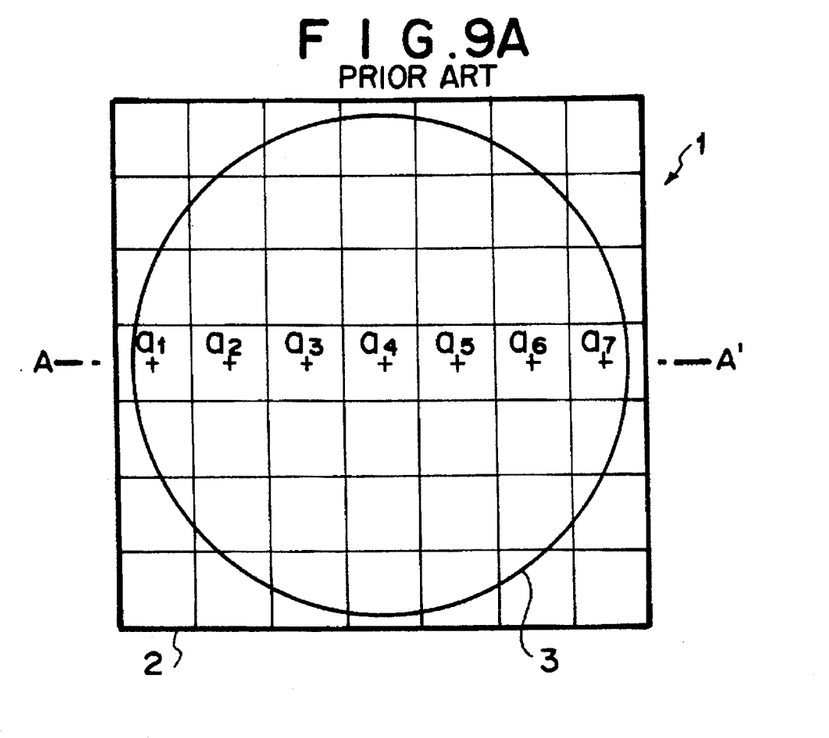
FIG. 9A shows a conventional integrator.

In the conventional intensity distribution simulation methods as described above, the effective light source which constitutes the integrator of the reticle illumination system is regarded as an assembly of the point sources. Each point source is allocated to each unit lens 2 (cell) of the integrator, and these unit lenses are assembled into the integrator 1 as shown in FIG. 9A. The actual intensity distribution of light just after emitted from each cell (unit lens) of the integrator 1 is shown in FIG. 9B.

Figure 9B:
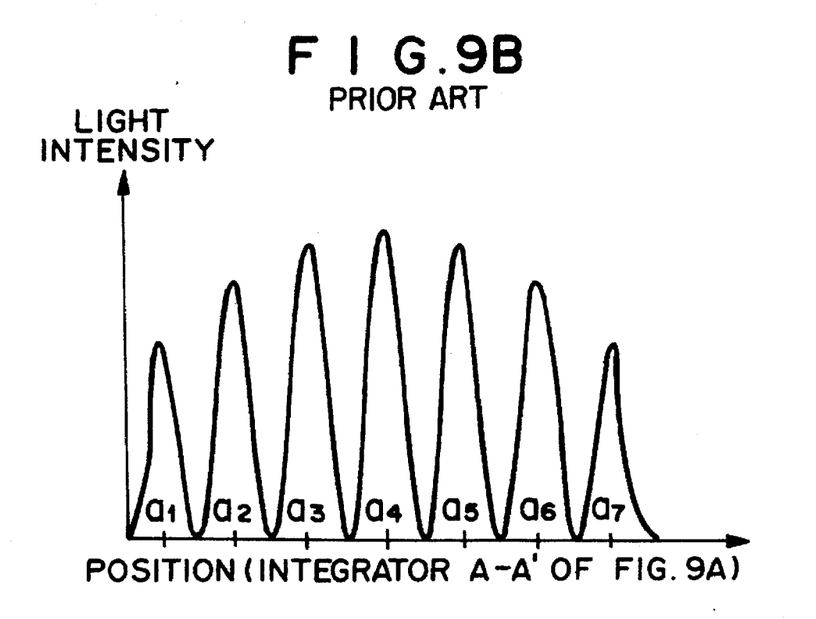
FIG. 9B is a graph showing the intensity distribution of the conventional integrator of FIG. 9A.

As is apparent from FIG. 9B, the light emitted from each cell 2 (corresponding to a point source) has an intensity distribution with its peak at the center thereof, and thus the total light intensity of the light from the integrator 1 has a discrete intensity distribution as shown in FIG. 9B. However, according to the conventional intensity distribution simulation methods as described above, the intensity distribution of the light emitted from the integrator (point sources) is treated as being uniform (fixed), that is, the intensity of the lights from the respective point sources are regarded as being uniform (fixed). If each cell of the integrator is fine and the number of the cells is above several tens, the number and position of the point sources (cells) have no effect on the imaging characteristics of the exposure system. Actually, an integrator whose cells are designed to be as fine as possible is used in the demagnification projection aligner for the manufacturing of the semiconductor devices to improve uniformity of illumination. Accordingly, in this case, it is unnecessary to take the layout of the integrator 1 into consideration.

Accordingly, in the intensity distribution simulation using the Hopkins theory, the effective light source in the integrator is generally treated as having an uniform intensity distribution over the effective area when TCC is calculated. Furthermore, even in a special case, consideration is paid to only the macro-level difference in light intensity (the difference in light intensity between the center and the periphery of the integrator). Furthermore, in the intensity distribution simulation using the Yeung's method, no consideration is paid to the layout of the integrator when each effective light source is divided into a finite number of point sources.

However, in the case where the oblique illumination such as the circular zonal illumination or four-point illumination is performed, the area of the aperture of the diaphragm becomes small and the number of effective cells of the integrator which are actually used for exposure also becomes small. Therefore, in this case, it has become more problematic to treat the effective light source as a light source having uniform intensity. That is, the present situation becomes serious to such an extent that the simulation result varies in accordance with the intensity distribution in the aperture of the diaphragm for the oblique illumination and the position of the point sources. Therefore, it is difficult to accurately simulate the projection image of an actual reticle pattern unless the intensity distribution of each cell of the integrator is individually considered.

SUMMARY OF THE INVENTION

An object of the present invention is to provide an intensity distribution simulation method in which a discrete intensity distribution on an integrator is considered to perform an accurate simulation even when an oblique illumination method is used.

According to a first aspect of the present invention, an intensity distribution simulation method for use in a lithographic process for semiconductor devices in which an effective light source constituting an integrator of plural unit lenses is divided into a finite number of point sources, and the intensity distribution of a projection image of a reticle pattern which is illuminated by each point source is calculated to synthesize the intensity distribution of the reticle pattern due to all the point sources, is characterized in that the intensity distribution of light due to each of the plural unit lenses constituting the integrator is modeled with at least one sub-point source, and the intensity distribution of the reticle pattern is calculated through the modeling step.

The modeling step of the intensity distribution of light due to each unit lens may contain a step of performing a weighting in proportion to the intensity distribution on the integrator, or a step of synthesizing the intensity distribution of light due to each unit lens on the basis of a main sub-point source disposed at the center of the unit lens and at least one auxiliary sub-point source disposed around the main sub-point source.

In the intensity distribution simulation method as described above, the integrator may comprise a homogenizer or fly-eye lens.

In the intensity distribution simulation method as described above, the one or more sub-point source used for modeling each unit lens may contain one sub-point source at the center of the unit lens, and four sub-point sources which are arranged at an angular interval of 90° around the central sub-point source.

In the intensity distribution simulation method as described above, the one or more sub-point source used for modeling each unit lens may contain one sub-point source at the center of the unit lens, and eight sub-point sources which are arranged at an angular interval of 45° around the central sub-point source.

In the intensity distribution simulation method as described above, the light intensity due to the one or more sub-point sources is set by sampling values having a Gaussian distribution whose center is located at the central one of the one or more sub-point sources, thereby performing the modeling step.

In the intensity distribution simulation method as described above, the light intensity distribution of the reticle pattern is obtained by sampling values having a Gaussian distribution whose center is located at the central one of the one or more sub-point sources, and then obtaining the light intensity due to the one or more sub-point sources on the basis of the envelope of the sampled values.

In the intensity distribution simulation method as described above, the light intensity distribution of the reticle pattern is obtained by calculating an approximate light intensity distribution for the light intensity due to the one or more sub-point sources on the basis of a Guassian distribution whose center is located at the central one of the one or more sub-point sources, and then digitalizing the calculated light intensity distribution due to the one or more sub-point sources by setting the light intensity above the half of the maximum light intensity due to each sub-point source to "1", and setting the light intensity below the half of the maximum light intensity due to each sub-point source to "zero".

According to a second aspect of the present invention, an intensity distribution simulation method for use in a lithographic process for semiconductor devices which contains a step of calculating a coherent transmission cross-coefficient on the basis of an intensity distribution function $S(x,y)$ of an effective light source and a pupil function $P(x',y')$ of a projection lens system according to Hopkins theory, is characterized by including a step of individually defining the intensity distribution function $S(x,y)$ of the effective light source every unit lens constituting an integrator.

The intensity distribution simulation method as described above may contain a step of dividing the intensity distribution function $S(x,y)$ into plural areas of different light intensity on the basis of the intensity distribution on the integrator.

In the intensity distribution simulation method as described above, the effective light source may contain, every unit lens, one sub-point source at the center of the unit lens and four sub-point sources which are arranged at an angular interval of 90° around the central sub-point source.

In the intensity distribution simulation method as described above, each unit lens may comprise one sub-point source at the center thereof and eight sub-point sources which are arranged at an angular interval of 45° around the central sub-point source.

In the intensity distribution simulation method as described above, the calculation step of the coherent transfer cross-coefficient may comprise the steps of dividing an integration area into plural areas of every unit lens of said integrator, coordinate-transforming each divided integration area and then performing an integration for each integration area using Gauss-Legendre method.

Furthermore, according to a third aspect of the present invention, an intensity distribution simulation method for use in a lithographic process for semiconductor devices which contains a step of calculating a coherent transmission cross-coefficient on the basis of an intensity distribution function $S(x,y)$ of an effective light source and a pupil function $P(x',y')$ of a projection lens system according to Hopkins theory, is characterized by including a step of dividing an integration range to calculating the coherent transmission cross-coefficient every unit lens constituting an integrator.

In the intensity distribution simulation method as described above, the effective light source may contain, every unit lens, one sub-point source at the center of said unit lens and four sub-point sources which are arranged at an angular interval of 90° around the central sub-point source.

In the intensity distribution simulation method as described above, the one or more sub-point source used for modeling each unit lens may contain one sub-point source at the center of said unit lens, and eight sub-point sources which are arranged at an angular interval of 45° around the central sub-point source.

BRIEF DESCRIPTION OF THE DRAWINGS

FIGS. 1A to 1D show the principle of a modeling of an integrator according to a first embodiment of the present invention, wherein

FIGS. 5A to 5D show the principle of another modeling of an integrator according to a second embodiment of the present invention, wherein

FIGS. 7A to 7D show a projection aligner (exposure device) and a diaphragm used in the projection aligner, wherein

DETAILED DESCRIPTION OF THE PREFERRED EMBODIMENTS

Preferred embodiments according to the present invention will be described hereunder with reference to the accompanying drawings.

First, a first embodiment will be described with reference FIG. 1 to FIG. 4.

Figure 1A:
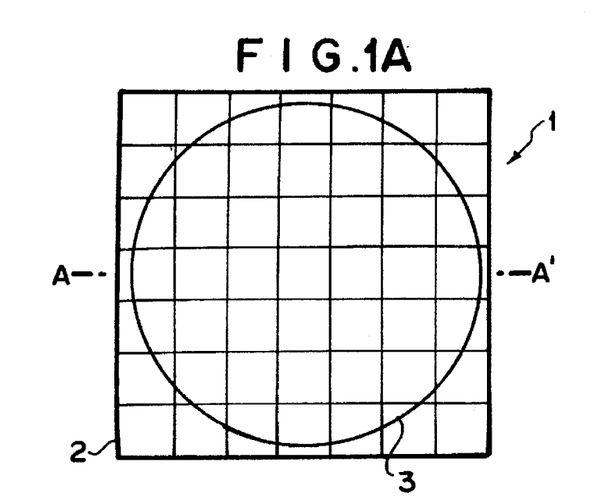
FIG. 1A shows an integrator used in the first embodiment.
Figure 1B:
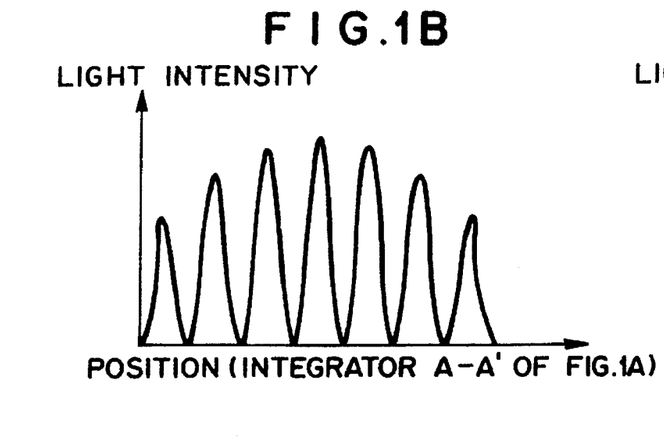
FIG. 1B shows an intensity (light intensity) distribution of the integrator shown in FIG. 1A.
Figure 1C:
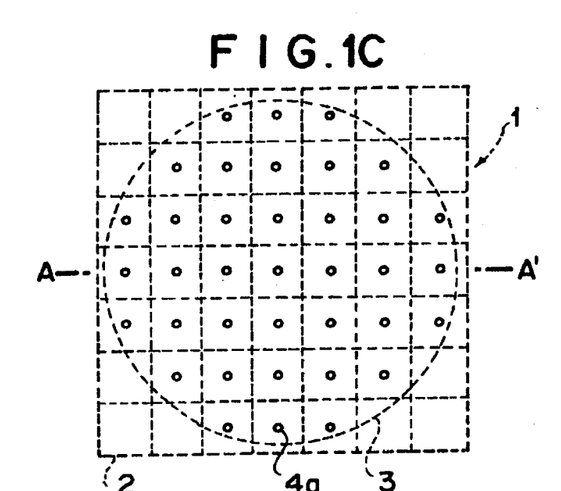
FIG. 1C shows a modeled integrator of the integrator shown in FIG. 1A.
Figure 1D:
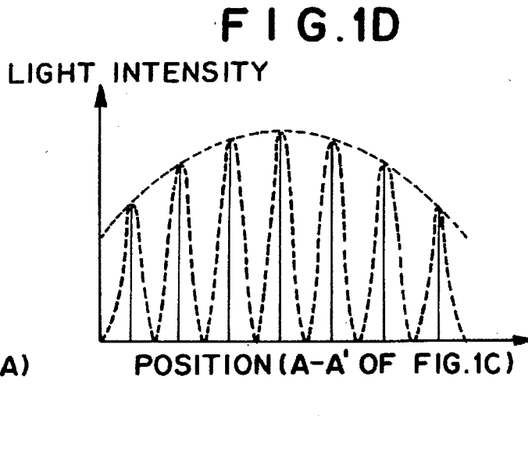
FIG. 1D shows an intensity distribution of the modeled integrator shown in FIG. 1C.

FIG. 1A schematically shows the layout of an integrator used in a first embodiment of the present invention, FIG. 1B is a graph showing the intensity distribution of light just after emitted from the integrator, FIG. 1C shows a modeled effective light source and FIG. 1D is a graph showing the light intensity distribution of the modeled effective light source which is taken along a line A—A' on the integrator of FIG. 1C.

An integrator 1 is an optical element which is formed by fabricating a plurality of same type unit lenses 2 in an effective area 3, and some unit lenses 2 are arranged even in a light-unilluminated area on the integrator to simplify the fabrication. Actually, only those unit lenses 2 which are disposed in an optical path and within the effective area 3 work effectively.

The modeling of the effective light source is performed using the light intensity distribution on the integrator 1 shown in FIG. 1B. First, a main sub-point light source 4a is disposed at the center of each unit lens 2 (referred to as "a cell" in the modeled effective light source) of the integrator as shown in FIG. 1C. Now, it is assumed that the light intensity distribution of each cell over the whole integrator 1 meets a Gaussian distribution, and an approximate light intensity distribution of each cell is calculated on this assumption as shown in FIG. 1D (as indicated by dotted lines of FIG. 1D). A value which is proportional to a value at each position of the approximate light intensity distribution is calculated as the light intensity at the position on the integrator 1. In this process, a measured value of the light intensity is not directly used because a measurement error is removed and this system is generalized. The light intensity on the integrator 1 is effected by a mount position of an ultra-high pressure mercury lamp which is an original light source, and thus it varies by several percentages. Accordingly, a measurement result when the ultra-high pressure mercury lamp is disposed at a position cannot be directly used, and it is necessary to be approximated in a symmetrical form with respect to upper-and-lower and right-and-left sides. With this approximation process, a general light intensity distribution can be obtained.

Thereafter, on the basis of the light intensity distribution which is approximated with the Gaussian distribution as shown in FIG. 1D, main sub-point light sources 4a are arranged in the effective area on the integrator 1 shown in FIG. 1C. This arrangement is performed as follows. That is, the measurement value of the light intensity distribution on each unit lens (cell) on the integrator 1 is approximated with the Gaussian distribution, and a position at which the maximum value of the intensity distribution (Gaussian distribution) is provided are calculated. This position corresponds to the peak position of the Gaussian distribution approximated light intensity distribution of each cell, and thus corresponds to the center of the light intensity distribution.

Figures 2, 3:
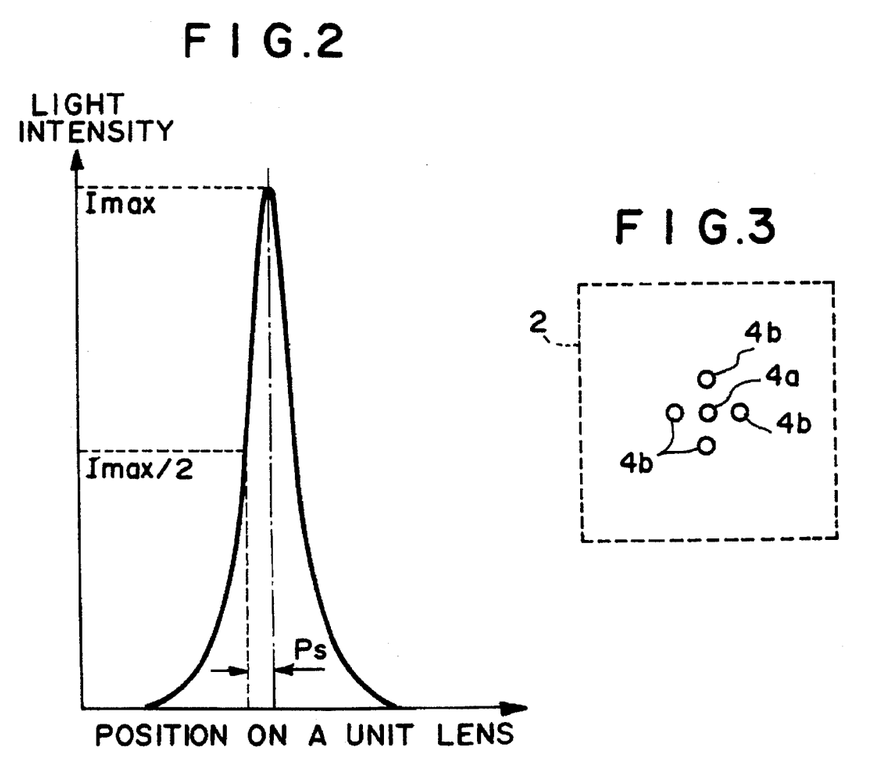
FIG. 2 is a graph showing the intensity distribution of a unit lens used in the first embodiment.
FIG. 3 shows an arrangement of the modeled unit lens of the first embodiment.

Subsequently, those positions Ps in the effective area which provide the half value of the maximum light intensity (the value at the center of the light intensity distribution of each cell) are obtained (that is, the transition position from the maximum value position is obtained), and auxiliary sub-point light sources 4b having the half light intensity of the main sub-point light sources 4a are located at the obtained transition positions as shown in FIG. 3. Through this process, a point light source 4 comprising one main sub-point source 4a and four auxiliary sub-point sources 4b is allocated to each unit lens (each cell) on the integrator 1, thereby the integrator 1 is modeled. And the four auxiliary sub-point sources 4b are arranged at an angular interval of 90° around the central sub-point source 4a.

A diaphragm (not shown) is disposed just behind the integrator 1, and the light intensity at a portion which is light-shielded by the diaphragm is set to zero. Accordingly, only the point sources which are located within the aperture of the diaphragm are used to perform the light intensity simulation.

As described above, the unit lenses constituting the integrator 1 are modeled with the plural sub-point sources, whereby the intensity distribution simulation of the reticle pattern projection image which is extremely approximate to the actual one can be performed using the M.Yeung's method.

If the design data of the optical system of the exposure device can be obtained, the light intensity distribution on the integrator 1 may be calculated with no actual measurement result by simulating the optical path of light from the ultra-high pressure mercury lamp. In this case, no design data of the optical system of the exposure device is supplied to an user, and thus the actual measurement is generally required.

Figure 4:
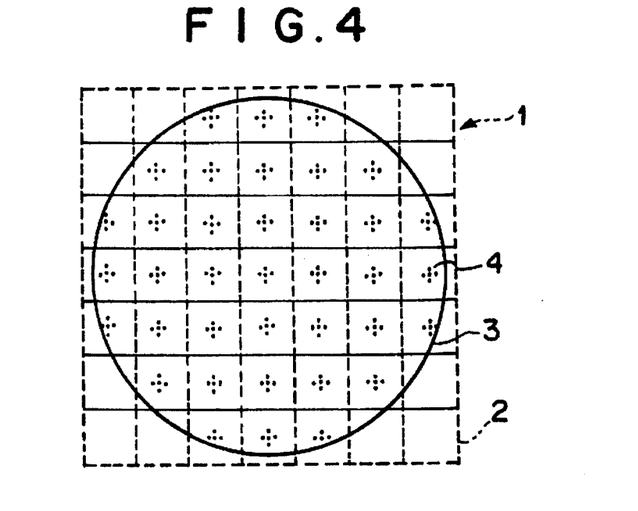
FIG. 4 shows a modification of the modeled integrator in the first embodiment.

In the embodiment as described above, each unit lens (cell) 2 of the integrator 1 is modeled with five sub-point sources. However, the modeling method is not limited to this manner. For example, each unit lens 2 of the integrator 1 may be modeled with one sub-point source at the center thereof and eight sub-point sources which are arranged at predetermined intervals, as example 45°, around the central sub-point source (totally, nine sub-point sources). In this case, the light intensity of the sub-point source at each position is set in proportion to the actual measurement value. In this modeling, if the unit lenses 2 constituting the integrator 1 are designed in a rectangular shape in section, the sub-point sources are arranged at an equidistance, so that the computer's calculation (treatment) can be facilitated.

The number of sub-point sources to which each unit lens is divided is also dependent on the aperture shape of the diaphragm used to the oblique illumination. Particularly when the number of cells of the integrator 1 which are effectively used is reduced to a small number due to the oblique illumination diaphragm, it is necessary to increase the number of sub-point sources for each cell. However, a simulation time is proportional to the number of the divided sub-point sources, and thus the number of the sub-point sources for each cell must be set to a proper one. Experientially, it is sufficient to approximate each cell (unit lens) of the integrator with five sub-point sources like the first embodiment as described above.

Next, a second embodiment will be described with reference to FIGS. 5A to 5D.

Figure 5A:
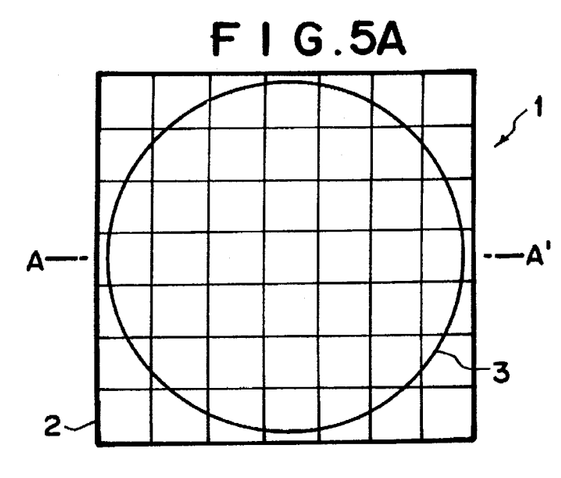
FIG. 5A shows an integrator used in the second embodiment.
Figure 5B:
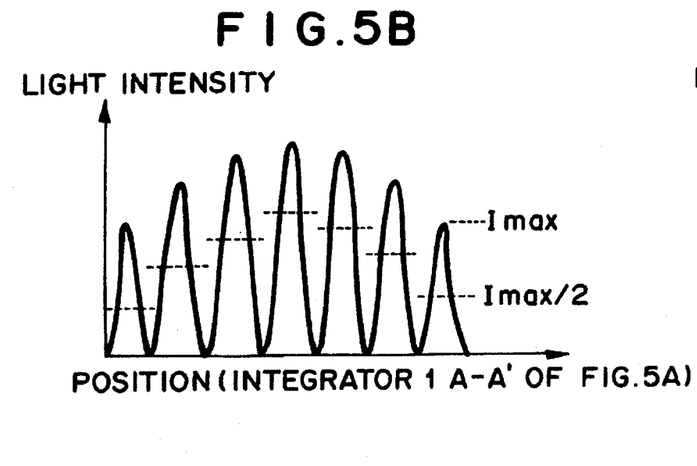
FIG. 5B shows an intensity (light intensity) distribution of the integrator shown in FIG. 5A.
Figure 5C:
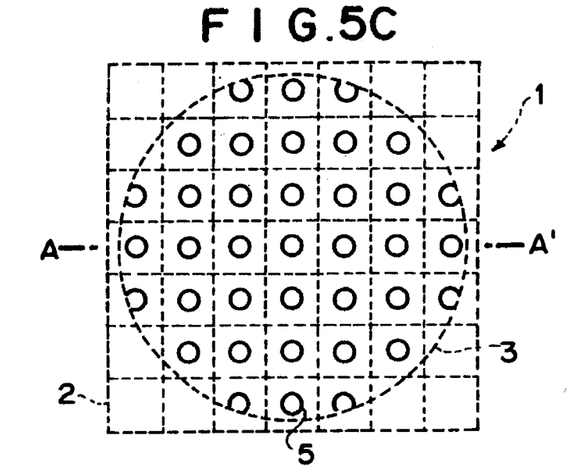
FIG. 5C shows a modeled integrator of the integrator shown in FIG. 5A.
Figure 5D:
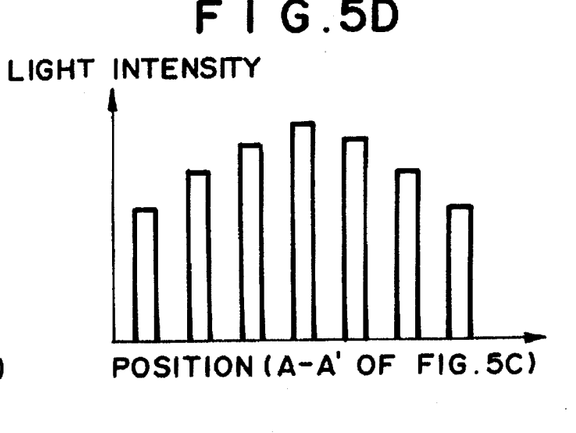
FIG. 5D shows an intensity distribution of the modeled integrator shown in FIG. 5C.

FIG. 5A schematically shows the layout of an integrator used in the second embodiment of the present invention, FIG. 5B is a graph showing the light intensity distribution which is obtained by actually measuring the light intensity distribution of light just after emitted from the integrator and then approximated on the assumption of the Gaussian distribution, FIG. 5C shows modeled effective light source and FIG. 5D is a graph showing the light intensity distribution of the modeled effective light source which is taken along a line A—A' on the integrator of FIG. 5C. In these figures, the same elements as the first embodiment are represented by the same reference numerals.

An integrator 1 is an optical element which is formed by fabricating a plurality of same type unit lenses 2 in an effective area 3, and some unit lenses 2 are arranged even in a light-unilluminated area on the integrator to simplify the fabrication. Actually, only those unit lenses 2 which are disposed in an optical path and within the effective area 3 work effectively.

The modeling of the effective light source is performed using the light intensity distribution on the integrator 1 shown in FIG. 5B. First, the light intensity of the effective light source is determined with the light intensity distribution on the integrator 1. That is, the light intensity is digitalized every unit lens (cell) of the integrator 1 using the half light intensity of the maximum light intensity Imax (Imax/2). In this case, a portion of each cell which provides the light intensity above Imax/2 is set to the fixed light intensity Imax, and the other portion of each cell which provides the light intensity less than Imax/2 is set to zero. Through this process, the modeled light intensity distribution shown in FIG. 5D is obtained. On the basis of the modeled light intensity distribution, the modeled effective light source 5 is set and arranged on the integrator 1 as shown in FIG. 5C to perform the modeling of the integrator 1.

Using the effective light source thus modeled, the coherent transfer cross-coefficient can be calculated according to the Hopkins method, and the light intensity distribution of the reticle pattern to be projected on the image plane can calculated.

In this embodiment, the digitalization (binary coding) of the light intensity distribution is performed by using only the value of Imax/2 as a threshold value. However, the digitalization may be performed by using multiple threshold values to set the level of the light intensity more finely (i.e., to achieve the multivalued light intensity distribution), thereby performing the more accurate intensity distribution simulation. However, in this case, the calculation (simulation) time is longer as the digitalized area becomes finer. Therefore, a proper digitalization mode should be selected in consideration of both of the calculation precision and the calculation time. In general, according to the diaphragm due to the oblique illumination, the digitalized area is finer as the number of the effective cells of the integrator 1 is smaller, and the binary coding as used in the above embodiment is sufficient experientially.

Figure 6:
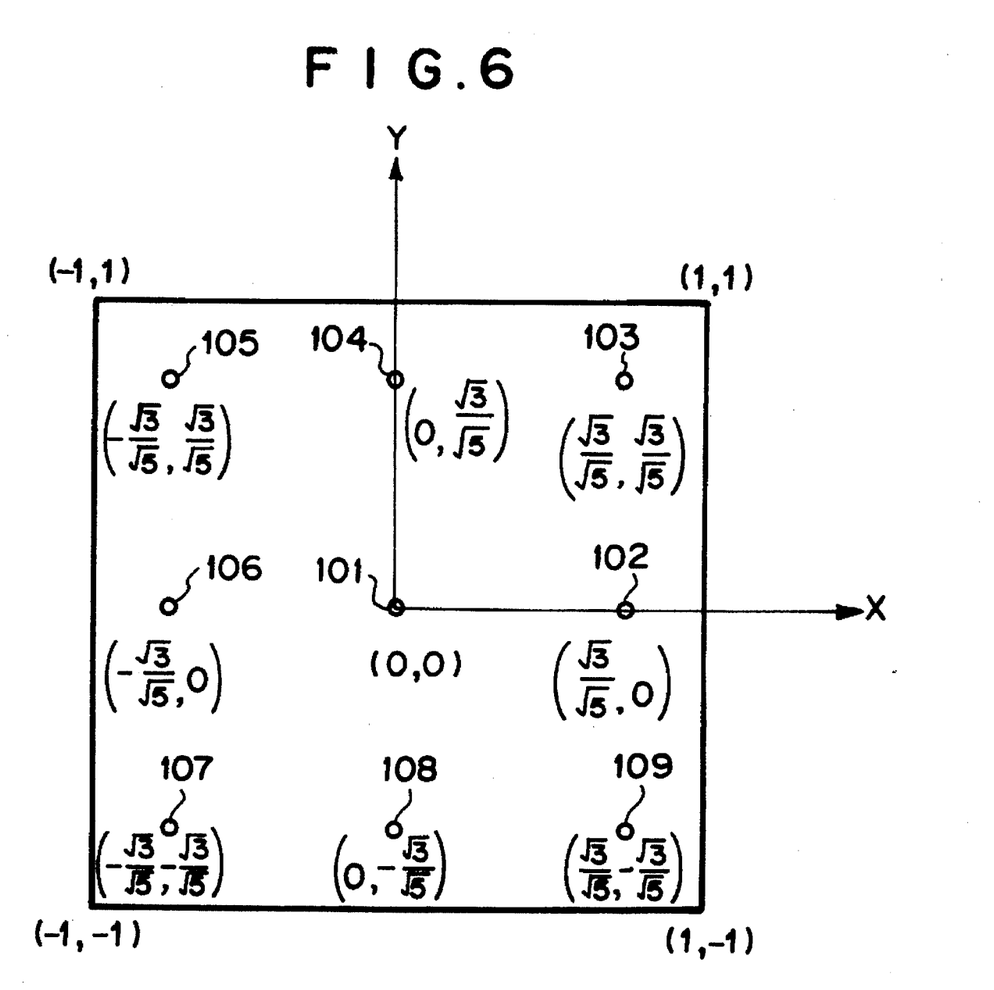
FIG. 6 shows an arrangement of unit lenses of an integrator according to a third embodiment of the present invention.

Next, a third embodiment will be described with reference to FIG. 6.

In this embodiment, the intensity of light just after emitted from the integrator 1 is measured actually, and an light intensity distribution is approximated on the assumption of the Gaussian distribution, like the first and second embodiments. Subsequently, when the coherent transfer cross-coefficient is calculated according to the Hopkins method, an integration area is divided for every unit lens of the integrator 1, each area is coordinate-transformed to an area $(-1 \leq x,y \leq 1)$, and then integration is performed on this area using Gauss-Legendre method. Thereafter, the values of all the effective areas are summed up to calculate the coherent transfer cross-coefficient. The Gauss-Legendre method is an integration method which is well used for the finite element method. For example, in the case where a function of x and y is integrated in a two-dimensional area $(-1 \leq x,y \leq 1)$ as shown in FIG. 6, sample sub-points are taken at an original sub-point 101 and sub-points 102 to 109, totally nine sub-points.

In this process, these sub-points are weighted with 8/9 for the original position (0,0) 101 and with 5/9 for the other positions 102 to 109, and the weighted values of these sub-points are summed up, whereby the integration can be accurately performed for a fifth-order or lower-order function of x,y. In this case, only the sample sub-points located within the aperture portion of the diaphragm just behind the integrator 1 are effectively used.

In this embodiment, the integration calculation is transformed to the calculation of four fundamental rules of arithmetics using the Gauss-Legendre method, so that the calculation time can be greatly shortened. Furthermore, like the first and second embodiments as described above, the calculation area is divided every unit lens 2 of the integrator 1 in consideration of the light intensity distribution in the unit lens 2 of the integrator 1, whereby the light intensity distribution of the projection image of the reticle pattern under the oblique illumination can be accurately simulated. And in this case, the approximation becomes more accurate as the number of sample points is increased (the relation of the number of sample points (x,y) and the order P of a polynomial which can be accurately calculated satisfy the equation: $P=2n-1$). In this case, the number of the sample points is set to a proper value in consideration of the calculation precision and the calculation time. In general, it is better to increase the number of the same points as the number of cells of the integrator 1 which are light-shielded by the oblique illumination diaphragm is large. Experientially, three sample sub-points are sufficient like the third embodiment because the order P is 5 and then the sample point n is 3.

As described above, according to the present invention, each cell of the integrator is modeled with plural sub-point sources in consideration of the discrete light intensity distribution on the integrator, and thus the simulation can be accurately performed even when the oblique illumination technique is used.

Furthermore, the weighting is conducted on the calculation in consideration of the discrete light intensity distribution on the integrator, and the effective light source is modeled in light intensity-different areas, so that the simulation can be accurately performed even when the oblique illumination technique is used.

Still furthermore, the effective light source is divided into plural areas every unit lens on the integrator, and the coherent transfer cross-coefficient is calculated every area using the Gauss-Legendre method, so that the accurate simulation can be performed at high speed under the oblique illumination.

What is claimed is:

1. An intensity distribution simulation method for a lithographic process for semiconductor devices, said lithographic process including an integrator having plural unit lenses which define an effective light source, said method comprising the steps of:

modeling a light intensity distribution of each of the plural unit lenses of the integrator which define said effective light source with at least two sub-point sources; and determining an intensity distribution of a reticle pattern illuminated by each of said at least two sub-point sources to synthesize the intensity distribution of the reticle pattern due to all of the at least two sub-point sources modeled for each of the plural unit lenses.

2. The intensity distribution simulation method as claimed in claim 1, wherein said modeling step includes performing a weighting of each of the at least two sub-point sources in proportion to the light intensity distribution on said integrator.

3. The intensity distribution simulation method as claimed in claim 1, wherein said integrator comprises a fly-eye lens.

4. The intensity distribution simulation method as claimed in claim 1, wherein, in the determining step, the light intensity due to all of said at least two sub-point sources is synthesized by sampling values having a Gaussian distribution whose center is located at a central one of said at least two sub-point sources.

5. The intensity distribution simulation method as claimed in claim 1, wherein, in the determining step, the light intensity distribution of the reticle pattern is determined by sampling values having a Gaussian distribution whose center is located at a central one of said at least two sub-point sources, and then obtaining the light intensity due to said at least two sub-point sources on the basis of an envelope of the sampled values.

6. An intensity distribution simulation method for a lithographic process for semiconductor devices, said lithographic process including an integrator having plural unit lenses which define an effective light source, said method comprising the steps of:

modeling a light intensity distribution of each of the plural unit lenses of the integrator which define said effective light source with sub-point sources; and determining an intensity distribution of a reticle pattern illuminated by each of said sub-point sources to synthesize the intensity distribution of the reticle pattern due to all of the sub-point sources modeled for each of the plural unit lenses, wherein each of the plural unit lenses is modeled with a main sub-point source disposed at the center of the unit lens and at least one auxiliary sub-point source disposed around said main sub-point source.

7. An intensity distribution simulation method for a lithographic process for semiconductor devices, said lithographic process including an integrator having plural unit lenses which define an effective light source, said method comprising the steps of:

modeling a light intensity distribution of each of the plural unit lenses of the integrator which define said effective light source with sub-point sources; and determining an intensity distribution of a reticle pattern illuminated by each of said sub-point sources to synthesize the intensity distribution of the reticle pattern due to all of the sub-point sources modeled for each of the plural unit lenses, wherein each of the plural unit lenses is modeled with one central sub-point source at the center of said unit lens, and four sub-point sources which are arranged at an angular interval of 90° around the central sub-point source.

8. An intensity distribution simulation method for a lithographic process for semiconductor devices, said lithographic process including an integrator having plural unit lenses which define an effective light source, said method comprising the steps of:

modeling a light intensity distribution of each of the plural unit lenses of the integrator which define said effective light source with sub-point sources; and determining an intensity distribution of a reticle pattern illuminated by each of said sub-point sources to synthesize the intensity distribution of the reticle pattern due to all of the sub-point sources modeled for each of the plural unit lenses, wherein each of the plural unit lenses is modeled with one central sub-point source at the center of said unit lens, and eight sub-point sources which are arranged at an angular interval of 45° around the central sub-point source.

9. An intensity distribution simulation method for a lithographic process for semiconductor devices, said lithographic process including an integrator having plural unit lenses which define an effective light source, said method comprising the steps of:

modeling a light intensity distribution of each of the plural unit lenses of the integrator which define said effective light source with sub-point sources; and determining an intensity distribution of a reticle pattern illuminated by each of said sub-point sources to synthesize the intensity distribution of the reticle pattern due to all of the sub-point sources modeled for each of the plural unit lenses, wherein, in the determining step, the light intensity distribution of the reticle pattern is determined by calculating an approximate light intensity distribution for the light intensity due to said sub-point sources on the basis of a Gaussian distribution whose center is located at a central one of said sub-point sources, and then digitalizing the calculated light intensity distribution due to said sub-point sources by setting the light intensity above the half of the maximum light intensity due to each sub-point source to "1", and setting the light intensity below the half of the maximum light intensity due to each sub-point source to "zero".

10. An intensity distribution simulation method for a lithographic process for semiconductor devices, said lithographic process including an integrator having plural unit lenses which define an effective light source, said method comprising the steps of:

modeling a light intensity distribution of each of the plural unit lenses of the integrator which define said effective light source with at least two sub-point sources;

calculating a coherent transmission cross-coefficient representing a degree of variation of a intensity distribution due to coherence on the basis of an intensity distribution function $S(x,y)$ of the effective light source for each of the plural unit lenses of the integrator and a pupil function $P(x',y')$ of a projection lens system according to Hopkins theory for the lithographic process; and individually defining the intensity distribution function $S(x,y)$ of the effective light source for each of the plural unit lenses of the integrator.

11. The intensity distribution simulation method as claimed in claim 10, further comprising a step of:

dividing the intensity distribution function $S(x,y)$ into plural areas of different light intensity on the basis of the intensity distribution on the integrator.

12. The intensity distribution simulation method as claimed in claim 10, wherein the calculating step comprises the steps of:

dividing an integration area into plural areas for every unit lens of said integrator;

coordinate-transforming each divided integration area; and performing an integration for each coordinate-transformed integration area using a Gauss-Legendre method.

13. An intensity distribution simulation method for a lithographic process for semiconductor devices comprising the steps of:

individually defining the intensity distribution function $S(x,y)$ of an effective light source for each unit lens of an integrator having plural unit lenses; and calculating a coherent transmission cross-coefficient representing a degree of variation of a intensity distribution due to coherence on the basis of an intensity distribution function $S(x,y)$ of the effective light source for each unit lens of the plural unit lenses of the integrator and a pupil function $P(x',y')$ of a projection lens system according to Hopkins theory for the lithographic process, wherein said effective light source is modeled with, in every unit lens, one central sub-point source at the center of said unit lens and four sub-point sources which are arranged at an angular interval of 90° around the central sub-point source.

14. An intensity distribution simulation method for a lithographic process for semiconductor devices comprising the steps of:

individually defining the intensity distribution function $S(x,y)$ of an effective light source for each unit lens of an integrator having plural unit lenses; and calculating a coherent transmission cross-coefficient representing a degree of variation of a intensity distribution due to coherence on the basis of an intensity distribution function S(x,y) of the effective light source for each unit lens of the plural unit lenses of the integrator and a pupil function P(x',y') of a projection lens system according to Hopkins theory for the lithographic process, wherein said effective light source is modeled with each unit lens having one central sub-point source at the center thereof and eight sub-point sources which are arranged at an angular interval of 45° around the central sub-point source.

15. An intensity distribution simulation method for a lithographic process for semiconductor devices, said lithographic process including an integrator having plural unit lenses which define an effective Light source, said method comprising the steps of:

modeling a light intensity distribution of each of the plural unit lenses of the integrator which define said effective light source with at least two sub-point sources;

calculating a coherent transmission cross-coefficient on the basis of an intensity distribution function S(x,y) of an effective light source for each of the plural unit lenses of the integrator and a pupil function P(x',y') of a projection lens system according to Hopkins theory for the lithographic process; and dividing an integration range to calculate the coherent transmission cross-coefficient representing a degree of variation of the intensity distribution due to coherence for each of the plural unit lenses of the integrator.

16. The intensity distribution simulation method as claimed in claim 15, wherein said effective light source is modeled with, in every unit lens, one central sub-point source at the center of said unit lens, and eight sub-point sources which are arranged at an angular interval of 45° around the central sub-point source.

17. An intensity distribution simulation method for a lithographic process for semiconductor devices comprising the steps of:

dividing an integration range to calculate the coherent transmission cross-coefficient representing a degree of variation of the intensity distribution due to coherence for each unit lens of an integrator having plural unit lenses; and calculating a coherent transmission cross-coefficient on the basis of an intensity distribution function S(x,y) of an effective light source for each unit lens of the plural unit lenses of the integrator and a pupil function P(x',y') of a projection lens system according to Hopkins theory for the lithographic process, wherein said effective light source is modeled with, in every unit lens, one central sub-point source at the center of said unit lens and four sub-point sources which are arranged at an angular interval of 90° around the central sub-point source.

18. A light intensity distribution simulation system for a projection installation in which an effective light source is constructed by an integrator with plural unit lenses, comprising:

modeling means for modeling a light intensity distribution of each of the plural unit lenses of the integrator with at least two sub-point sources; and determining means for determining a light intensity distribution of a reticle pattern illuminated by each of said at least two sub-point sources to synthesize the intensity distribution of the reticle pattern due to all of the at least two sub-point sources modeled for each of the plural unit lenses.

* * * * *